US010231369B2

United States Patent
Furutani et al.

(10) Patent No.: US 10,231,369 B2
(45) Date of Patent: *Mar. 12, 2019

(54) SHIELD CAP AND METHOD FOR MANUFACTURING THE SAME

(71) Applicant: IBIDEN CO., LTD., Ogaki (JP)

(72) Inventors: Toshiki Furutani, Ogaki (JP); Takema Adachi, Ogaki (JP); Hidetoshi Noguchi, Ogaki (JP); Shota Tachibana, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/783,053

(22) Filed: Oct. 13, 2017

(65) Prior Publication Data

US 2018/0110159 A1 Apr. 19, 2018

(30) Foreign Application Priority Data

Oct. 13, 2016 (JP) .................................. 2016-201844

(51) Int. Cl.
*H05K 9/00* (2006.01)
*B32B 37/02* (2006.01)
(Continued)

(52) U.S. Cl.
CPC ......... *H05K 9/0024* (2013.01); *B29C 70/885* (2013.01); *B32B 37/02* (2013.01);
(Continued)

(58) Field of Classification Search
CPC .... H05K 9/0024; H05K 9/003; H05K 9/0073; H05K 9/0088; H05K 3/4697;
(Continued)

(56) References Cited

U.S. PATENT DOCUMENTS

2002/0003695 A1* 1/2002 Spratte ................. H05K 9/0024
361/818
2006/0002099 A1* 1/2006 Stoneham ............ H05K 9/0024
361/816
(Continued)

FOREIGN PATENT DOCUMENTS

JP 2002-237542 A 8/2002

OTHER PUBLICATIONS

STIC Search Report.*

*Primary Examiner* — Steven T Sawyer
*Assistant Examiner* — Sagar Shrestha
(74) *Attorney, Agent, or Firm* — Oblon, McClelland, Maier & Neustadt, L.L.P.

(57) ABSTRACT

A shield cap for protecting an electronic component includes a cap member having a side wall portion and a ceiling portion, a conductive film formed on the cap member such that the conductive film is formed to shield electromagnetic waves, and a metal layer formed on a portion of the side wall portion such that the metal layer is interposed between the conductive film and the portion of the side wall portion. The side wall and ceiling portions are forming an accommodation space to accommodate an electronic component, and the metal layer is formed on a surface of the side wall portion on the opposite side of a surface of the side wall portion facing the ceiling portion and interposed between the conductive film and the side wall portion.

20 Claims, 16 Drawing Sheets

(51) Int. Cl.
*B32B 37/14* (2006.01)
*B29C 70/88* (2006.01)

(52) U.S. Cl.
CPC ........... *B32B 37/142* (2013.01); *H05K 9/003* (2013.01); *H05K 9/0079* (2013.01); *H05K 9/0088* (2013.01)

(58) Field of Classification Search
CPC ..... H05K 9/0079; H01L 23/552; H01L 23/60; H01L 2924/3512; H01L 2924/1432; H01L 2924/3025; H01L 2924/1679; H01L 2924/16251; H01L 2924/1434; B29C 70/885; B32B 37/02; B32B 37/142
See application file for complete search history.

(56) References Cited

U.S. PATENT DOCUMENTS

| | | | |
|---|---|---|---|
| 2011/0293126 A1* | 12/2011 | Maekawa | H04R 19/005 381/355 |
| 2016/0268215 A1* | 9/2016 | Nakamura | H01L 23/3737 |
| 2017/0200682 A1* | 7/2017 | Lin | H01L 23/552 |

\* cited by examiner

US 10,231,369 B2

SHIELD CAP AND METHOD FOR MANUFACTURING THE SAME

CROSS-REFERENCE TO RELATED APPLICATIONS

The present application is based upon and claims the benefit of priority to Japanese Patent Application No. 2016-201844, filed Oct. 13, 2016, the entire contents of which are incorporated herein by reference.

BACKGROUND OF THE INVENTION

Field of the Invention

The present invention relates to shield cap that protects an electronic component on a substrate.

Description of Background Art

Japanese Patent Laid-Open Publication No. 2002-237542 describes a metal cap that includes a metal foil tape and polyamide imide coated on the metal foil tape. The entire contents of this publication are incorporated herein by reference.

SUMMARY OF THE INVENTION

According to one aspect of the present invention, a shield cap for protecting an electronic component includes a cap member having a side wall portion and a ceiling portion, a conductive film formed on the cap member such that the conductive film is formed to shield electromagnetic waves, and a metal layer formed on a portion of the side wall portion such that the metal layer is interposed between the conductive film and the portion of the side wall portion. The cap member is formed such that the side wall portion and the ceiling portion are forming an accommodation space to accommodate an electronic component, the ceiling portion has a first surface facing the accommodation space and a second surface on the opposite side with respect to the first surface, the side wall portion has a third surface facing the ceiling portion, a fourth surface on the opposite side with respect to the third surface, a fifth surface facing the accommodation space, and a sixth surface on the opposite side with respect to the fifth surface, and the metal layer is formed on the fourth surface of the side wall portion such that the metal layer is interposed between the conductive film and the fourth surface of the side wall portion.

According to another aspect of the present invention, a method for manufacturing a shield cap for protecting an electronic component includes preparing a first prepreg for forming a ceiling portion having a first surface, preparing a second prepreg for forming a side wall portion having a third surface, laminating the first prepreg onto the second prepreg such that a laminate including the first prepreg and the second prepreg is formed to have the first surface of the first prepreg and the third surface of the second prepreg face each other, forming an accommodation space for accommodating an electronic component in the laminate such that a cap member including the side wall portion and the ceiling portion is formed, forming a metal layer on a portion of the side wall portion, and forming a conductive film on the cap member such that the conductive film is formed to shield electromagnetic waves. The cap member is formed such that the ceiling portion has the first surface facing the accommodation space and a second surface on the opposite side with respect to the first surface, the side wall portion has the third surface facing the ceiling portion, a fourth surface on the opposite side with respect to the third surface, a fifth surface facing the accommodation space, and a sixth surface on the opposite side with respect to the fifth surface, and the metal layer is formed on the fourth surface of the side wall portion such that the metal layer is interposed between the conductive film and the fourth surface of the side wall portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
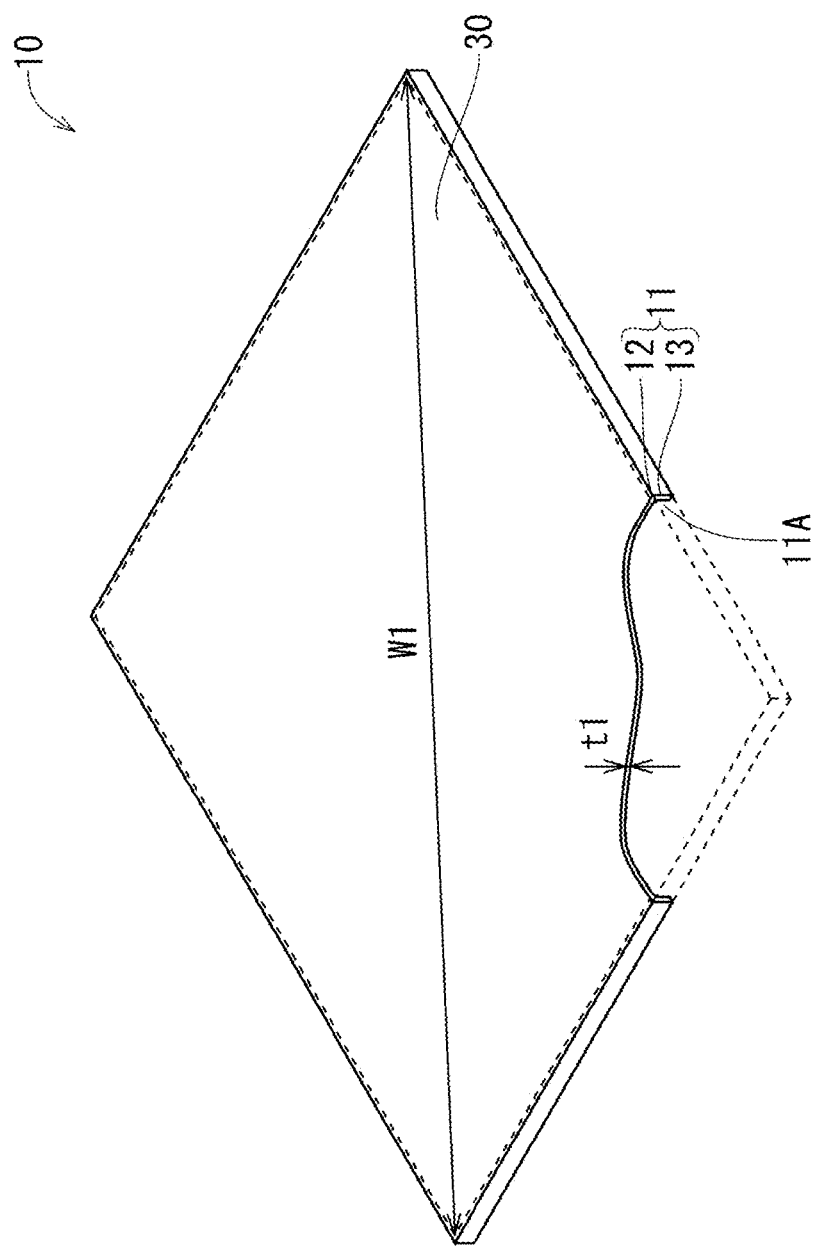
FIG. 1 is a perspective view of a shield cap according to a first embodiment of the present invention.

Embodiments will now be described with reference to the accompanying drawings, wherein like reference numerals designate corresponding or identical elements throughout the various drawings.

First Embodiment

A first embodiment of the present invention is described with reference to FIG. 1-12. As illustrated in FIG. 1, a shield cap 10 of the first embodiment includes a resin cap member 11, and a conductive film 30 that is formed on the cap member 11. The cap member 11 includes a ceiling part 12 and a side wall part 13. The cap member 11 is a case for protecting an electronic component such as an IC chip.

Therefore, the cap member 11 has a space (11A) for accommodating an electronic component. The side wall part 13 surrounds the space (11A), and the ceiling part 12 covers the space (11A). In FIG. 1, the side wall part 13 completely surrounds the space (11A), and the ceiling part 12 completely covers the space (11A). Further, the side wall part 13 and the ceiling part 12 are connected at an outer periphery of the ceiling part 12.

The ceiling part 12 has a thickness (t1). The thickness (t1) is 50 μm or more and 300 μm or less. Preferably, the thickness (t1) is 60 μm or more and 150 μm or less. In this case, the ceiling part 12 has appropriate strength and weight. A diagonal line (W1) of the ceiling part 12 has a length of 100 or more times the thickness (t1).

Figure 2:
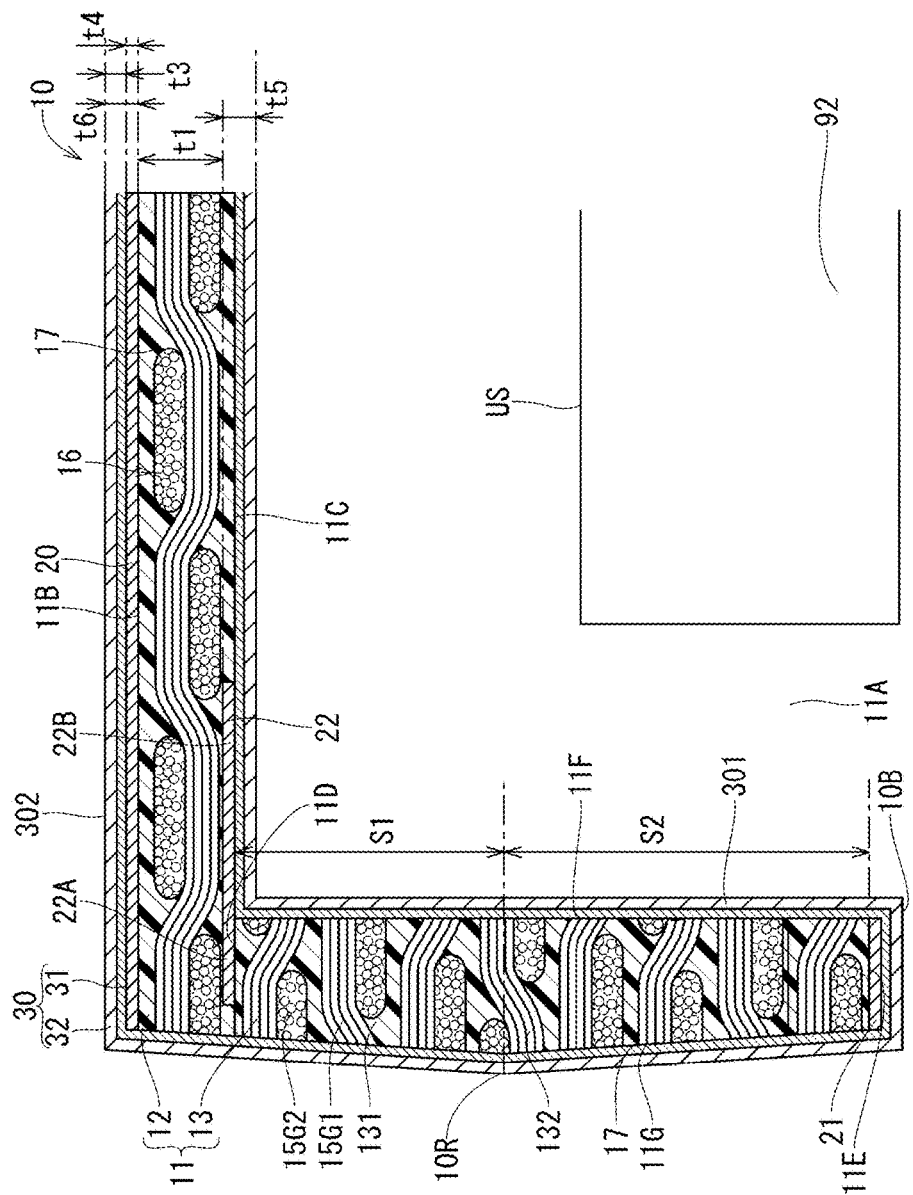
FIG. 2 is an enlarged cross-sectional view of the shield cap.

As illustrated in FIG. 2, the ceiling part 12 is formed of a resin 17 and a reinforcing material 16. Since the ceiling part 12 contains the reinforcing material 16, the ceiling part 12 has high strength. Therefore, deflection of the ceiling part 12 can be suppressed.

Figure 3A:
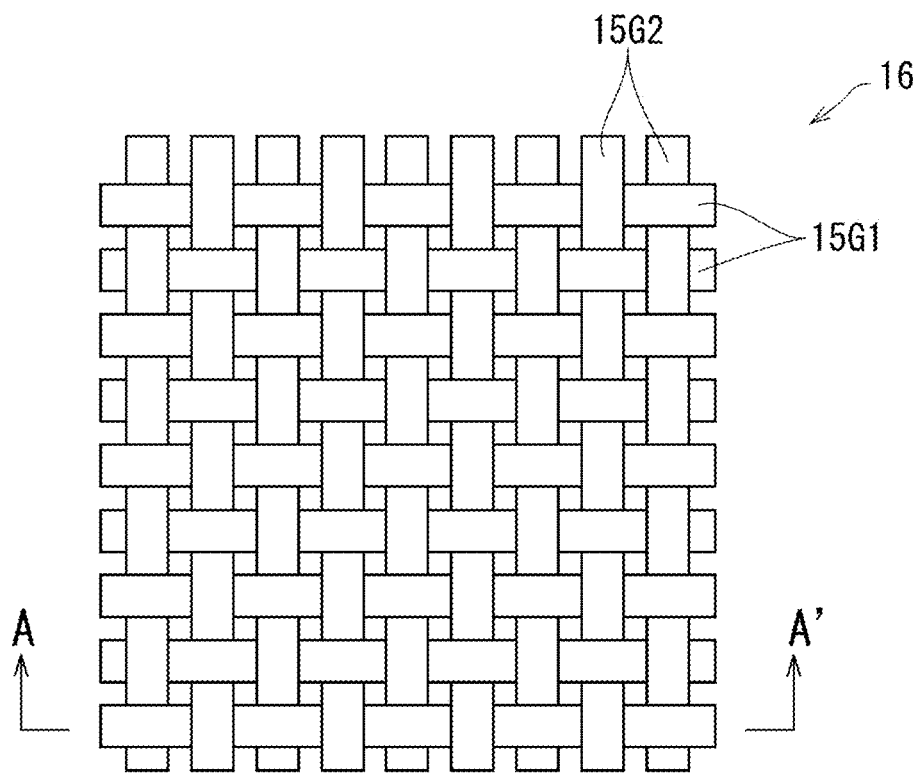
FIG. 3A is a plan view of a glass cloth.
Figure 3B:
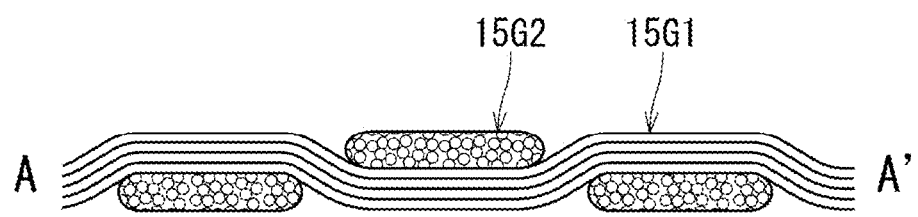
FIG. 3B is an enlarged cross-sectional view of the glass cloth.

The resin 17 of the ceiling part 12 is, for example, epoxy. Examples of resins other than epoxy include polyimide and phenol. Examples of the reinforcing material 16 of the ceiling part 12 include a glass cloth, glass fiber and aramid fiber. A glass cloth is preferred. FIGS. 3A and 3B illustrate an example of a glass cloth. As illustrated in FIGS. 3A and 3B, the glass cloth has warp (15G2) formed of glass fiber and weft (15G1) formed of glass fiber. The warp (15G2) and the weft (15G1) are woven such that they intersect each other.

Figure 5:
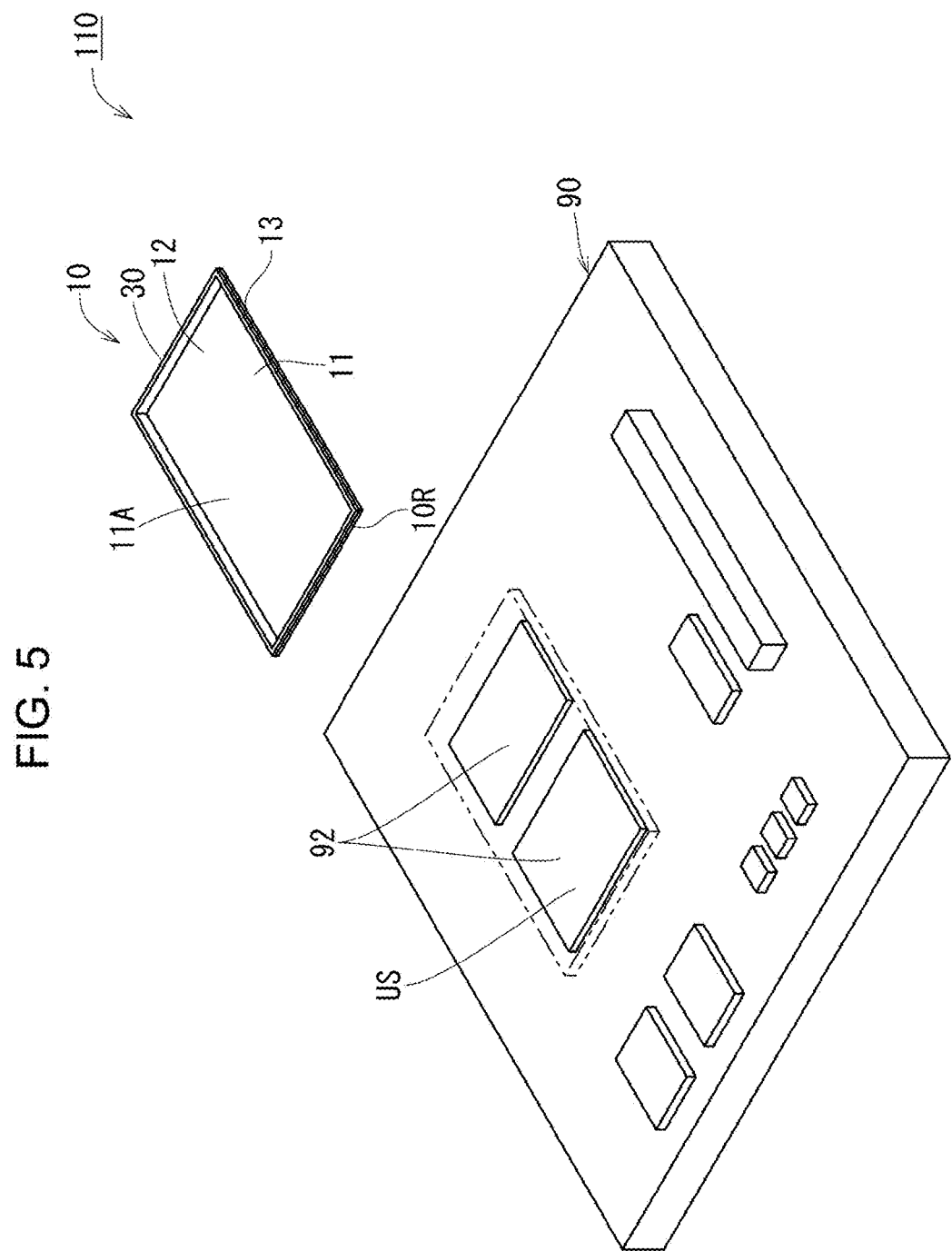
FIG. 5 illustrates an application example of the shield cap.

As illustrated in FIG. 2, the ceiling part 12 has a first surface (11C), and a second surface (11B) that is on an opposite side of the first surface (11C). The first surface (11C) faces the space (11A). The first surface (11C) and the second surface (11B) are formed substantially parallel to each other. When an electronic component 92 having an upper surface (US) is accommodated in the space (11A), the first surface (11C) faces the upper surface (US) of the electronic component 92. The upper surface (US) of the electronic component 92 is illustrated in FIGS. 2 and 5.

As illustrated in FIG. 2, the reinforcing material 16 and the second surface (11B) of the ceiling part 12 are formed substantially parallel to each other. The second surface (11B) and an upper surface of the ceiling part 12 are the same surface. In FIG. 2, the reinforcing material 16 is one sheet of a glass cloth. However, it is also possible that the ceiling part 12 has multiple sheets of glass cloths. When one sheet of the reinforcing material 16 is provided, the reinforcing material 16 is formed at a center in a thickness direction of the ceiling part 12.

As illustrated in FIG. 2, the side wall part 13 has a third surface (11D) and a fourth surface (11E) that is on an opposite side of the third surface (11D). The first surface (11C) and the third surface (11D) face each other. The first surface (11C) and the third surface (11D) have a substantially parallel relationship. The side wall part 13 has a fifth surface (11F) and a sixth surface (11G), which is on an opposite side of the fifth surface (11F), between the third surface (11D) and the fourth surface (11E). The fifth surface (11F) faces the space (11A).

Figure 4:
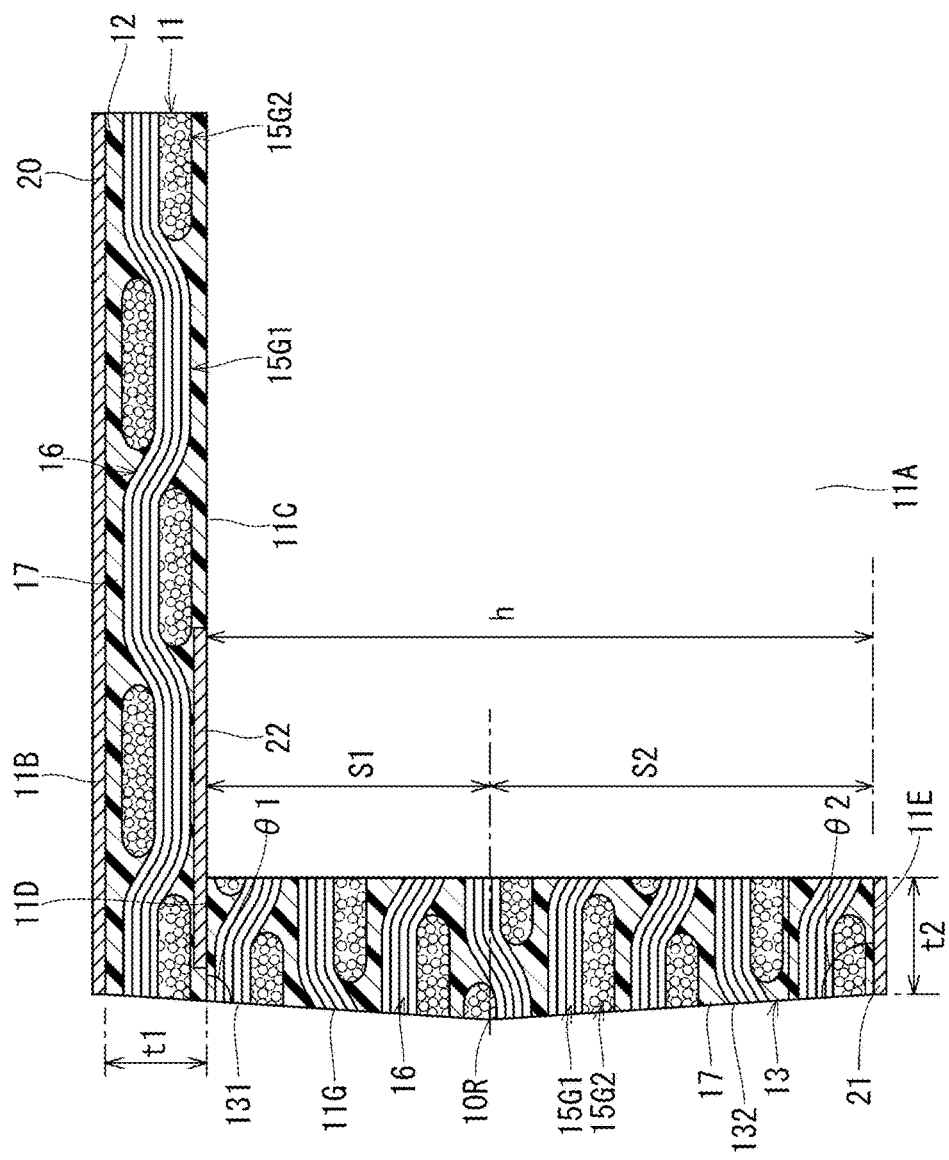
FIG. 4 is an enlarged cross-sectional view of a cap member.

As illustrated in FIG. 4, the side wall part 13 has a thickness (t2). In FIG. 4, the thickness (t2) varies from the third surface (11D) toward the fourth surface (11E). However, an average value of the thickness (t2) of the side wall part 13 is substantially the same as the thickness (t1) of the ceiling part 12. Further, the thickness (t2) of the side wall part 13 is ⅕ or less times a height (h) (distance between the third surface (11D) and the fourth surface (11E)) of the side wall part 13.

Similar to the ceiling part 12, the side wall part 13 is formed of a resin 17 and a reinforcing material 16. Examples of the resin 17 of the side wall part 13 are the same as the examples of the resin 17 of the ceiling part 12. Examples of the reinforcing material 16 of the side wall part 13 are the same as the examples of the reinforcing material 16 of the ceiling part 12. It is also possible that the resin 17 of the side wall part 13 is different from the resin 17 of the ceiling part 12. It is also possible that the reinforcing material 16 of the side wall part 13 is different from the reinforcing material 16 of the ceiling part 12. The reinforcing material 16 of the side wall part 13 is formed parallel to the second surface (11B) of the ceiling part 12. The side wall part 13 have multiple sheets of the reinforcing material 16, and the multiple sheets of the reinforcing material 16 are laminated substantially in parallel.

As illustrated in FIG. 4, the thickness (t2) of the side wall part 13 is not constant. The side wall part 13 is formed by a first side wall part 131 that includes the third surface (11D), and a second side wall part 132 that includes the fourth surface (11E). The first side wall part 131 and the second side wall part 132 are integrally formed. An intersection point of the first side wall part 131 and the second side wall part 132 forms a bent part (10R). The thickness (t2) of the first side wall part 131 increases from the third surface (11D) toward the bent part (10R). Therefore, the sixth surface (11G) of the first side wall part 131 is inclined such that a distance between the sixth surface (11G) of the first side wall part 131 and the space (11A) increases from the third surface (11D) toward the bent part (10R). This increases strength of the side wall part 13.

The thickness (t2) of the second side wall part 132 increases from the fourth surface (11E) toward the bent part (10R). Therefore, the sixth surface (11G) of the second side wall part 132 is inclined such that a distance between the sixth surface (11G) of the second side wall part 132 and the space (11A) increases from the fourth surface (11E) toward the bent part (10R).

A first angle (θ1) between third surface (11D) and the sixth surface (11O) of the first side wall part 131 and a second angle (θ2) between the fourth surface (11E) and the sixth surface (11G) of the second side wall part 132 may be the same or different, but are preferably different. For example, the angles (θ1, θ2) are 95 degrees or more and 120 degrees or less.

As illustrated in FIG. 2, the first side wall part 131 has a length (S1), and the second side wall part 132 has a length (S2). The length (S1) and the length (S2) may be the same or different, but are preferably different. This increases the strength of the side wall part 13. For example, a ratio (S1/S2) of the length (S1) to the length (S2) is 0.7 or more and 1.3 or less. It is possible that the thickness (t2) is constant.

The conductive film 30 is preferably formed on the second surface (11B) and the sixth surface (11G), which are facing outward, among the surfaces (11B, 11C, 11D, 11E, 11F, 11G) of the cap member 11. The conductive film 30 is formed by plating, and the conductive film 30 on the second surface (11B) and the conductive film 30 on the sixth surface (11G) are preferably simultaneously formed. The conductive film 30 may be further formed on the first surface (11C) and the fifth surface (11F), which face the space (11A). Further, the conductive film 30 may be formed on the fourth surface (11E). It is preferable that the conductive film 30 completely cover the surfaces (11B, 11C, 11E, 11F, 11G). In this case, the conductive film 30 is simultaneously formed on the surfaces (11B, 11C, 11E, 11F, 11G). By forming the conductive film 30, a shielding effect of the electronic component 92 accommodated in the shield cap 10 can be increased. The conductive film 30 may have an opening.

A second metal layer 20 can be formed on the second surface (11B) of the ceiling part 12. Substantially the entire second surface (11B) is covered by the second metal layer 20. For example, the second metal layer 20 is formed from a second metal foil. The conductive film 30 is formed on the second metal layer 20. The second metal layer 20 is sandwiched by the second surface (11B) and the conductive film 30.

A third metal layer 21 can be formed on the fourth surface (11E) of the side wall part 13. Substantially the entire fourth surface (11E) is covered by the third metal layer 21. For example, the third metal layer 21 is formed from a third metal foil. The conductive film 30 is formed on the third metal layer 21. The third metal layer 21 is sandwiched by the fourth surface (11E) and the conductive film 30.

A first metal layer 22 can be formed between the first surface (11C) of the ceiling part 12 and the third surface (11D) of the side wall part 13. For example, the first metal layer 22 is formed from a first metal foil. The first metal layer 22 may extend to the first surface (11C) exposed by the space (11A). The first metal layer 22 is formed by a portion (first portion (22A) of the first metal layer 22) sandwiched by the first surface (11C) and the third surface (11D) and a portion (second portion (22B) of the first metal layer 22) formed on the first surface (11C) above the space (11A). The first portion (22A) of the first metal layer 22 and the second portion (22B) of the first metal layer 22 are continuous. It is preferable that the first metal layer 22 partially cover the third surface (11D). This allows the first surface (11C) of the ceiling part 12 and the third surface (11D) of the side wall part 13 to be bonded to each other via the resin 17 of the ceiling part 12 and the resin 17 of the side wall part 13. As a result, the ceiling part 12 and the side wall part 13 are strongly bonded to each other. The first metal layer 22 may cover the entire first surface (11C) above the space (11A). When the conductive film 30 is formed on the first surface (11C) above the space (11A), the first metal layer 22 is sandwiched by the first surface (11C) and the conductive film 30. The first portion (22A) of the first metal layer 22 may completely cover the third surface (11D). The second portion (22B) of the first metal layer 22 may partially cover the first surface (11C) above the space (11A). Examples of the metal foils for forming the metal layers (20, 21, 22) include a copper foil, a nickel foil, and an aluminum foil. A copper foil is preferred. The metal foils each have a thickness of 3 μm or more and 30 μm or less.

When the conductive film 30 is formed on the fifth surface (11F), the conductive film 30 is formed directly on the fifth surface (11F). When the conductive film 30 is formed on the sixth surface (11G), the conductive film 30 is formed directly on the sixth surface (11G). The conductive film 30 is formed by an electroless plating film 31 and an electrolytic plating film 32 on the electroless plating film 31. The electroless plating film 31 and the electrolytic plating film 32 are each formed, for example, from a copper plating film. It is also possible that the conductive film 30 is formed by the electroless plating film 31 only.

When the third metal layer 21 is projected on the second surface (11B) with light perpendicular to the second surface (11B), the third metal layer 21 has a frame shape. In the case where the first metal layer 22 partially covers the first surface (11C) above the space (11A), when the first metal layer 22 is projected on the second surface (11B) with light perpendicular to the second surface (11B), the first metal layer 22 has a frame shape.

As illustrated in FIG. 2, the conductive film 30 has a thickness (t3). The metal layers (20, 21, 22) each have a thickness (t4). The metal layers (20, 21, 22) may have different thicknesses. A sum of the thickness (t3) of the conductive film 30 formed on the first surface (11C) of the ceiling part 12 and the thickness (t4) of the first metal layer 22 is a thickness (t5). A sum of the thickness (t3) of the conductive film 30 formed on the second surface (11B) of the ceiling part 12 and the thickness (t4) of the second metal layer 20 is a thickness (t6). A sum of the thickness (t5) and the thickness (t6) is a sum (t7). The sum (t7) is smaller than the thickness (t1) of the ceiling part 12. By reducing the sum (t7), a height of the shield cap 10 can be reduced. A ratio (t7/t1) of the sum (t7) to the thickness (t1) is preferably 0.05 or more and 0.4 or less. A specific gravity of the ceiling part 12 is reduced. The weight of the ceiling part 12 is reduced. Deflection of the ceiling part 12 can be suppressed. For example, the thickness (t3) of the conductive film 30 is 3 μm or more and 25 μm or less. The thickness (t1) is a distance between the conductors sandwiching the ceiling part 12. In FIG. 2, the thickness (t1) is a distance between the first metal layer 22 and the second metal layer 20.

FIG. 5 illustrates an application example 110 of the shield cap 10 of the first embodiment. The application example 110 includes a printed wiring board 90, an electronic component 92 such as a semiconductor chip mounted on the printed wiring board 90, and the shield cap 10 of the embodiment protecting the electronic component 92. Examples of the electronic component 92 include a CPU and a memory. Further, a protrusion amount of the electronic component 92 from an upper surface of the printed wiring board 90 is, for example, 0.2 mm or more and 1.5 mm or less. The shield cap 10 is fixed to the printed wiring board 90 such that the electronic component 92 is accommodated in the space (11A). The fourth surface (11E) of the side wall part 13 is fixed to the printed wiring board 90 with an adhesive. Examples of the adhesive include solder, a resin adhesive, and a conductive paste. The shield cap 10 is mounted on the printed wiring board 90, for example, using a mounter. When the side wall part 13 of the shield cap 10 has the first side wall part 131 and the second side wall part 132, the sixth surface (11G) has a portion projecting outward (see FIG. 4). Therefore, the side wall part 13 of the shield cap 10 is gripped by the mounter, and the shield cap 10 moves, the projecting portion has an anti-slip effect. The shield cap 10 can be stably mounted. When an amount of the adhesive for fixing the shield cap 10 to the printed wiring board 90 is excessive, the adhesive protrudes onto the printed wiring board 90. However, when the second side wall part 132 is reduced in thickness toward the printed wiring board 90, the protrusion amount of the adhesive can be suppressed.

As illustrated in FIG. 2, the shield cap 10 of the first embodiment has a first conductive film 301 (the conductive film 30 formed on the first surface (11C) and the fifth surface (11F)) and a second conductive film 302 (the conductive film 30 formed on the second surface (11B) and the sixth surface (11G)). Thereby, the electronic component 92 is doubly covered. A high shielding effect is expected. The electronic component 92 in the shield cap 10 is likely to be greatly affected by electromagnetic waves reaching the ceiling part 12. For example, the second metal layer 20 and the conductive film 30 are formed on the second surface (11B) of the ceiling part 12. As a result, the thickness (t6) of the layers formed of a conductive material is increased.

Therefore, an amount of electromagnetic waves passing through the ceiling part 12 can be reduced. Further, heat dissipation performance is also increased.

The first conductive film 301 and the second conductive film 302 are connected to each other by the conductive film 30 on the fourth surface (11E) of the side wall part 13, or by the third metal layer 21. It is also possible that the first conductive film 301 and the second conductive film 302 are connected to each other both by the conductive film 30 on the fourth surface (11E) of the side wall part 13 and by the third metal layer 21. Therefore, shielding performance and heat dissipation performance are improved.

The shield cap 10 of the first embodiment has the first side wall part 131 and the second side wall part 132. The sixth surface (11G) of the first side wall part 131 and the sixth surface (11G) of the second side wall part 132 are inclined with respect to the first surface (11C). The two surfaces are not parallel to each other. In this case, the sixth surface (11G) is bent. When the sixth surface (11G) of the first side wall part 131 and the sixth surface (11G) of the second side wall part 132 substantially vertically intersect with the first surface (11C), the sixth surface (11G) is formed as flat surface. When the sixth surface (11G) of the first side wall part 131 and the sixth surface (11G) of the second side wall part 132 are compared in area size, the former is larger than the latter. Therefore, when the shield cap 10 has the first side wall part 131 and the second side wall part 132, more electromagnetic waves can be reflected by the sixth surface (11G). Further, the electromagnetic waves can be diffusely reflected. The shielding performance is expected to be improved. When the area of the sixth surface (11G) is large, the heat dissipation performance is also expected to be improved. As a result, malfunction of the electronic component 90 can be reduced.

When the cap member 11 is formed from the resin 17 only, the strength of the cap member 11 is expected to be insufficient. Therefore, the ceiling part 12 is expected to bend. The space (11A) of the shield cap 10 is expected to be narrowed. For example, a gap between the cap member 11 and the upper surface of the printed wiring board 90 is reduced. It is expected to be difficult to accommodate the electronic component 92 in the space (11A). Further, the side wall part 13 is expected to bend. For example, it is expected to be difficult to fix the shield cap 10 to the printed wiring board 90. The shielding performance is likely to deteriorate. The shield cap 10 is likely to collide with the electronic component 92 due to an impact or the like. Functions of the electronic component such as a semiconductor chip are expected to deteriorate.

In contrast, in the cap member 11 of the shield cap 10 of the first embodiment, the ceiling part 12 has the reinforcing material 16. The side wall part 13 has the reinforcing material 16. The ceiling part 12 and the side wall part 13 are strengthened by the reinforcing material 16. Therefore, the shape of the shield cap 10 of the first embodiment is easily maintained. According to the shield cap 10 of the first embodiment, defects caused by deflection of the ceiling part 12 or bending of the side wall part 13 can be suppressed. When the reinforcing material 16 is formed parallel to the second surface (11B), durability of the shield cap 10 is improved. The shield cap 10 is unlikely to collide with the electronic component 92 due to an impact or the like. A crack is unlikely to occur in the cap member 11. Performance of the semiconductor element is unlikely to deteriorate.

The third metal layer 21 is formed from a metal foil. When the third metal layer 21 is formed from a metal foil on the fourth surface (11E) of the cap member 11, flatness of a surface (10B) (lower surface of the shield cap 10) bonded to the printed wiring board 90 can be increased. As a result, a gap is unlikely to be formed between the printed wiring board 90 and the lower surface (10B) of the shield cap 10. The lower surface (10B) is illustrated in FIG. 2. Further, when the shield cap 10 is fixed to the printed wiring board using solder, the conductive film 30 on the fourth surface (11E) may diffuse into the solder. However, when the third metal layer 21 is present on the fourth surface (11E), the shield cap 10 can be reliably fixed to the printed wiring board 90 using solder. Further, by forming the third metal layer 21, the heat dissipation performance is also increased. As a result, malfunction of the electronic component 90 can be reduced.

An example of a method for manufacturing the shield cap 10 of the first embodiment is illustrated below.

Figure 6:
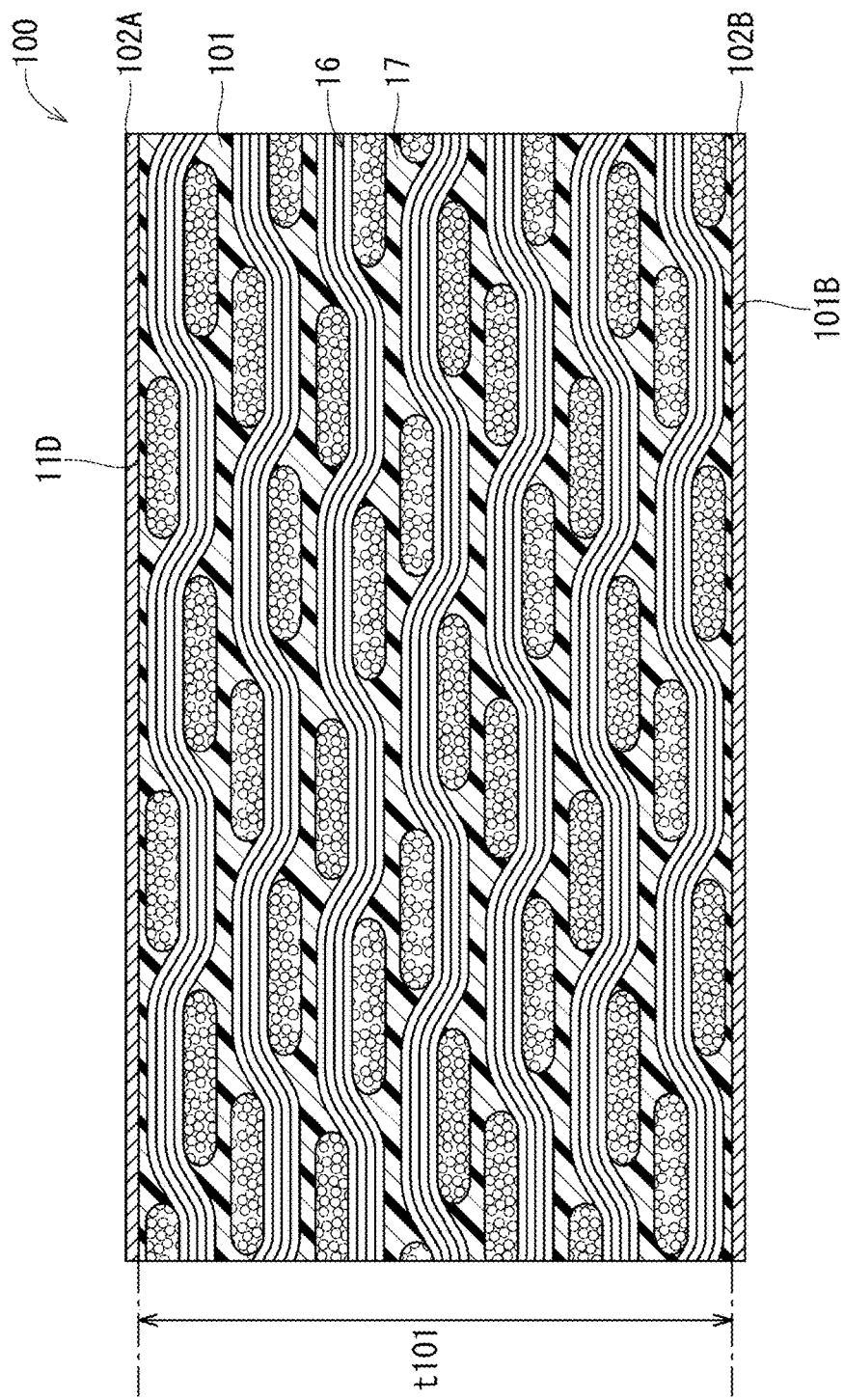
FIG. 6 is a cross-sectional view illustrating a manufacturing process of the shield cap.

(1) As illustrated in FIG. 6, a double-sided copper-clad laminated plate 100 is prepared. The double-sided copper-clad laminated plate 100 has a first insulating layer 101, and a copper foil (102A) and a copper foil (102B) that sandwich the first insulating layer 101. The copper foil (102A) is the first metal foil. The first insulating layer 101 has the third surface (11D) and a seventh surface (101B) that is on an opposite side of the third surface (11D). The copper foil (102A) is laminated on the third surface (11D) of the first insulating layer 101. The copper foil (102B) is laminated on the seventh surface (101B) of the first insulating layer 101. The first insulating layer 101 is formed of multiple sheets of the reinforcing material 16 and the resin 17. The first insulating layer 101 is formed from a second prepreg. Further, the first insulating layer 101 has a thickness (t101) of 400 μm or more and 700 μm or less. The copper foils (102A, 102B) each have a thickness of 3 μm or more and 30 μm or less.

Figure 7:
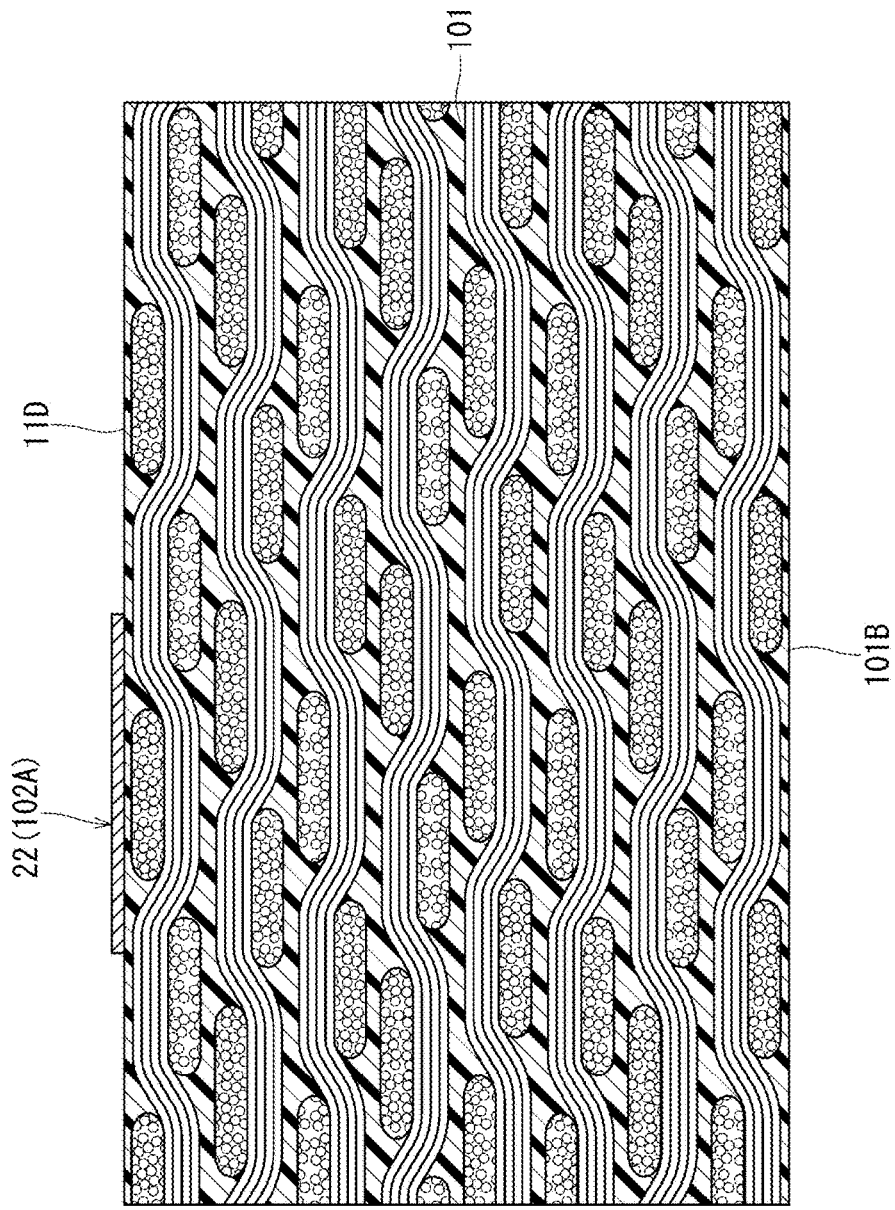
FIG. 7 is a cross-sectional view illustrating a manufacturing process of the shield cap.

(2) As illustrated in FIG. 7, the first metal layer 22 is formed on the third surface (11D) from the copper foil (102A) using a subtractive method. Further, the copper foil (102B) is completely removed.

Figure 8:
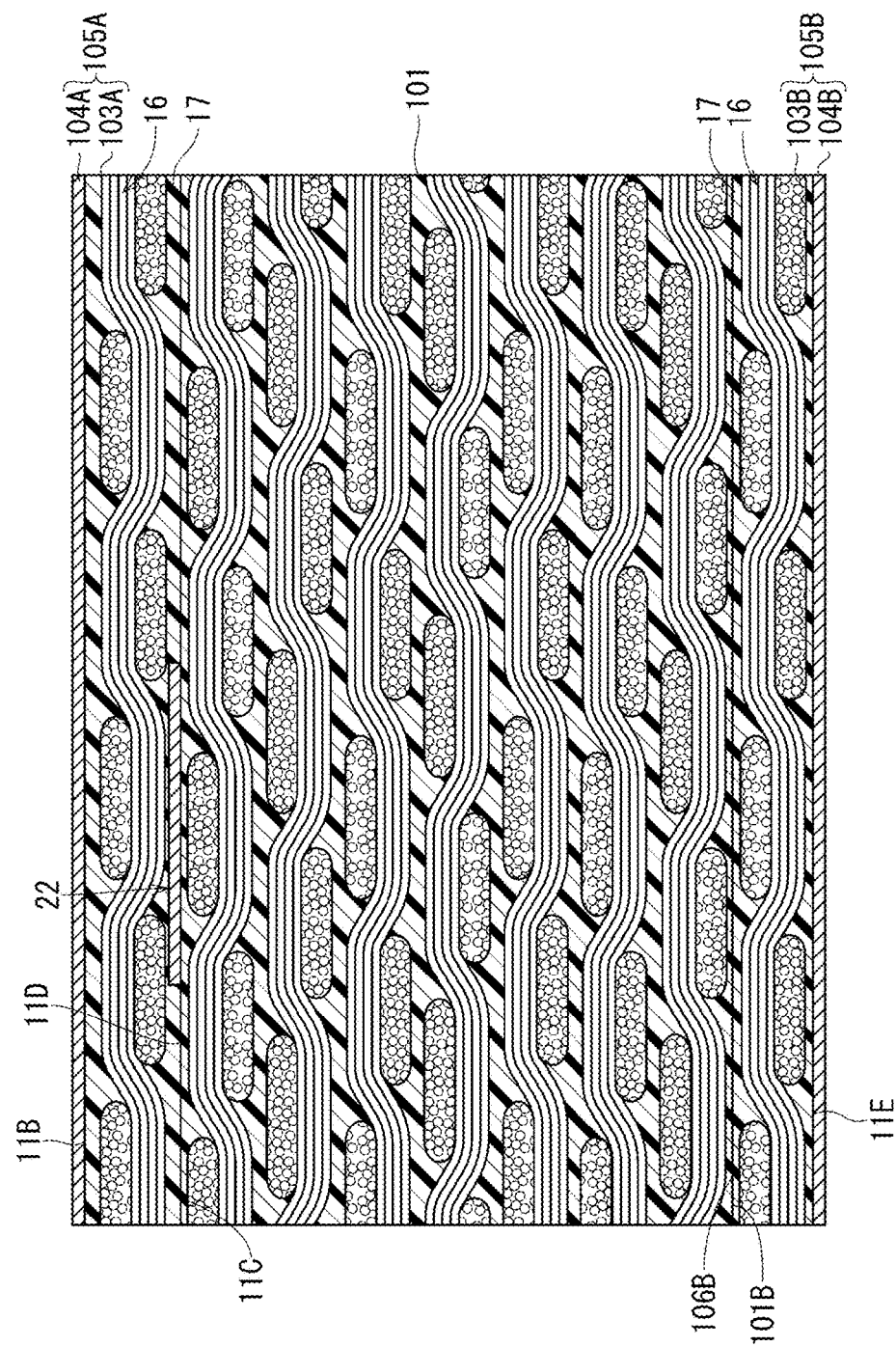
FIG. 8 is a cross-sectional view illustrating a manufacturing process of the shield cap.

(3) As illustrated in FIG. 8, a first prepreg is laminated on the third surface (11D) and the first metal layer 22. Further, a copper foil (104A) as the second metal foil is laminated on the first prepreg. A prepreg is laminated on the seventh surface (101B). Further, a copper foil (104B) as the third metal foil is laminated on the prepreg. Thereafter, by hot pressing, a second insulating layer (103A) having the second surface (11B) and the first surface (11C) that is on an opposite side of the second surface (11B) is formed from the first prepreg on the third surface (11D). The first surface (11C) and the third surface (11D) face each other. A third insulating layer (103B) having an eighth surface (106B) and the fourth surface (11E) that is on an opposite side of the eighth surface (106B) is formed from the prepreg on the seventh surface (101B). The eighth surface (106B) and the seventh surface (101B) face each other. As a result, the second insulating layer (103A) and the copper foil (104A) are sequentially formed on the third surface (11D) and the first metal layer 22. The third insulating layer (103B) and the copper foil (104B) are sequentially formed on the seventh surface (101B). A laminate formed by the first insulating layer 101, the second insulating layer (103A), the third insulating layer (103B), the first metal layer 22, and the copper foils (104A, 104B) is obtained. The third insulating layer (103B) is not essential. When the third insulating layer (103B) is not provided, the seventh surface (101B) is the fourth surface (11E). Then, the copper foil (104B) is directly formed on the fourth surface (11E). The second insulating layer (103A) and the third insulating layer (103B) are each formed of one sheet of the reinforcing material 16 and the resin 17. The second insulating layer (103A) and the third insulating layer (103B) each have a thickness of 50 μm or more and 300 μm or less. The copper foils (104A, 104B) each have a thickness of 3 μm or more and 30 μm or less.

Figure 9:
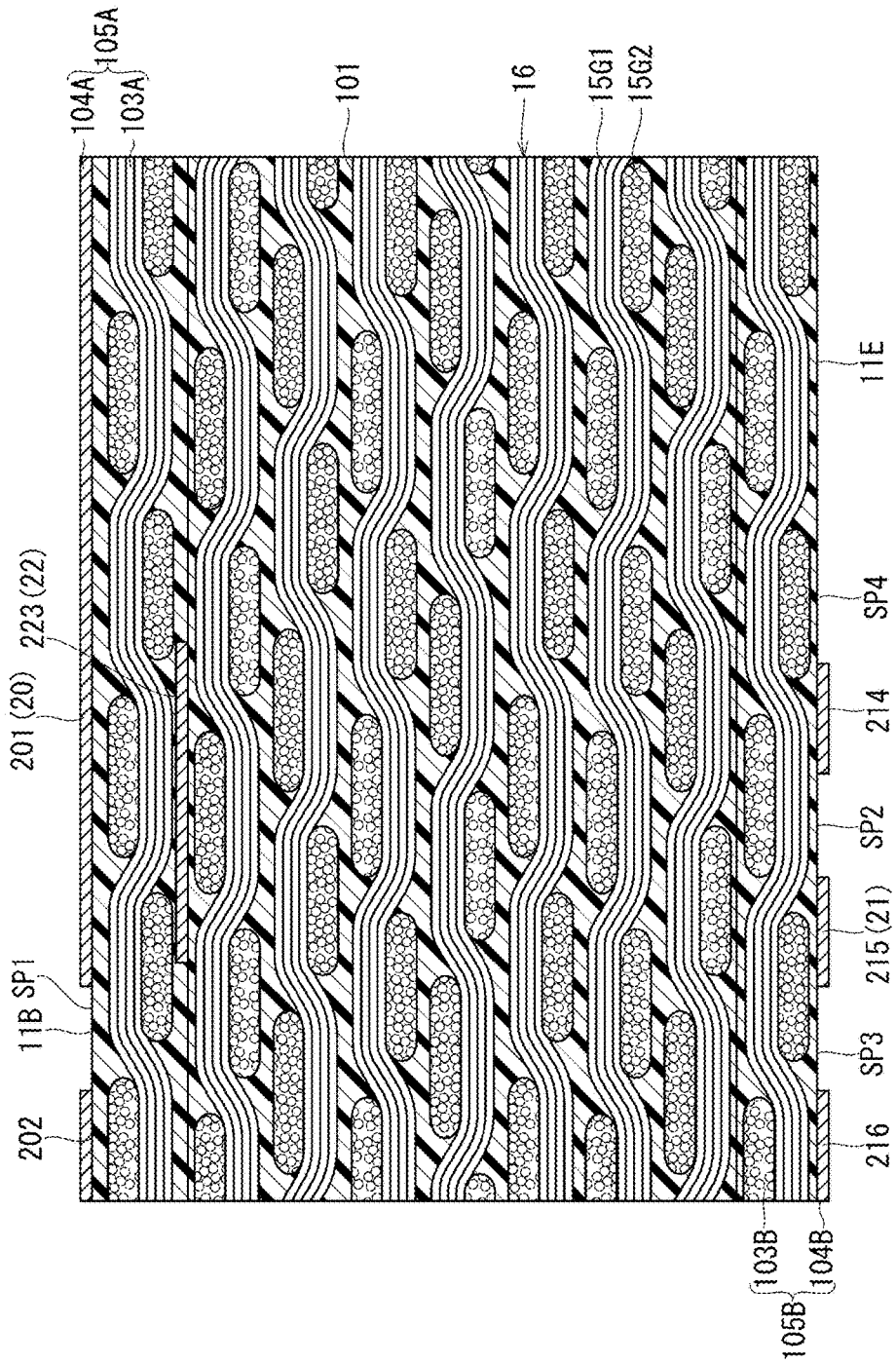
FIG. 9 is a cross-sectional view illustrating a manufacturing process of the shield cap.
Figure 15A:
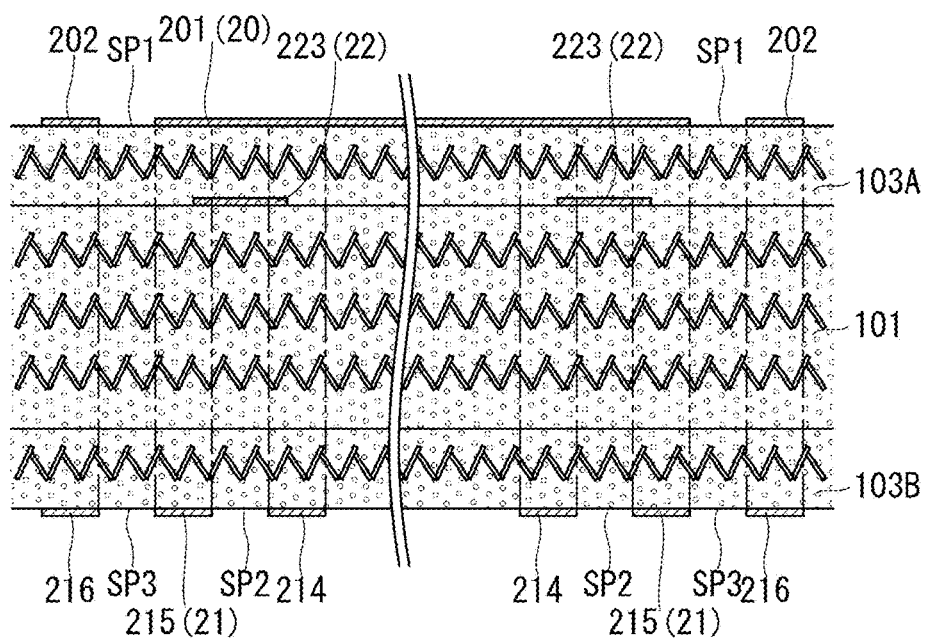
FIG. 15A is a cross-sectional view illustrating a manufacturing process of the shield cap.
Figure 15B:
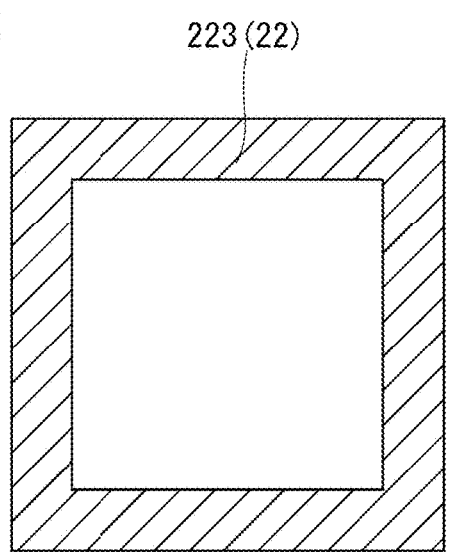
FIG. 15B is a plan view of a conductor part.
Figure 16A:
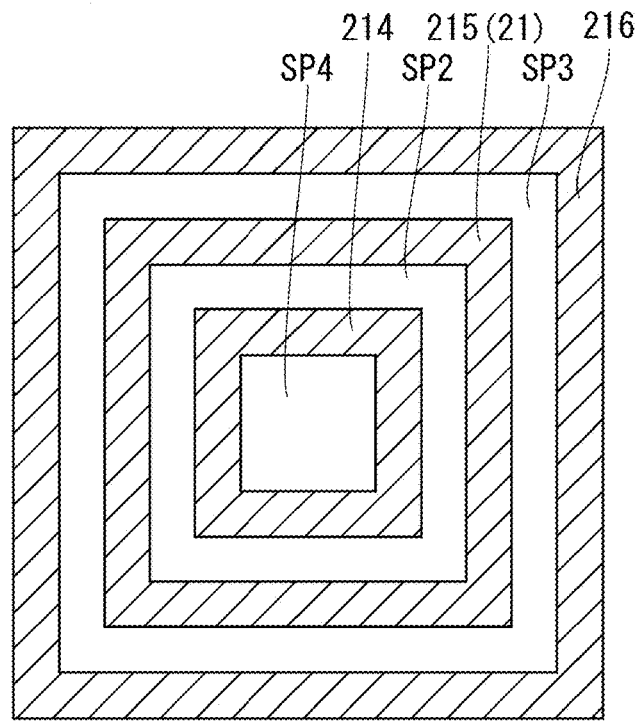
FIGS. 16A and 16B are plan views of conductor parts.
Figure 16B:
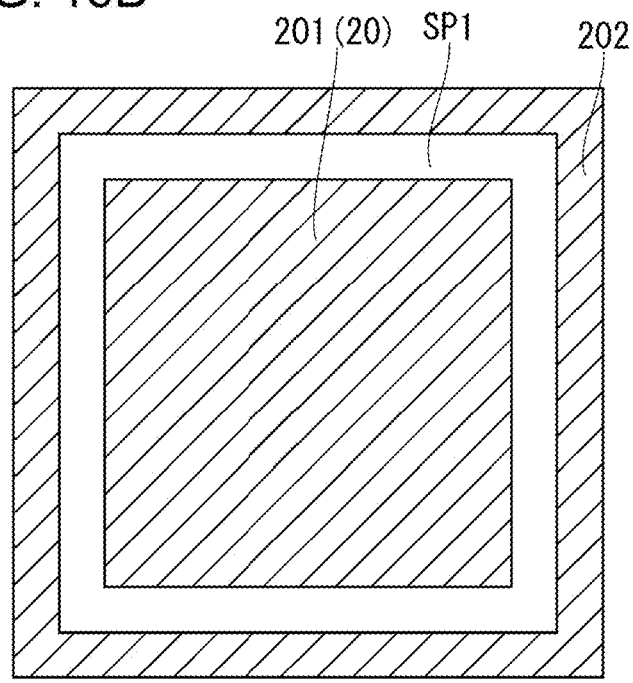

(4) As illustrated in FIG. 9, a first conductor part 201 and a second conductor part 202 are formed on the second surface (11B) from the copper foil (104A) using a subtractive method. Further, a fourth conductor part 214, a fifth conductor part 215 and a sixth conductor part 216 are formed on the fourth surface (11E) from the copper foil (104B) using a subtractive method. FIG. 16B illustrates planar shapes of the first conductor part 201 and the second conductor part 202, which are formed on the second surface (11B). For example, the first conductor part 201 is a quadrangle, and is surrounded by the second conductor part 202. There is a space (SP1) between the first conductor part 201 and the second conductor part 202. The first conductor part 201 and the ceiling part 12 have substantially the same shape. The first conductor part 201 corresponds to the second metal layer 20. FIG. 15B illustrates a planar shape of the first metal layer 22. The first metal layer 22 includes, for example, frame-shaped third conductor part 223. FIG. 16A illustrates planar shapes of a fourth conductor part 214, a fifth conductor part 215 and a sixth conductor part 216, which are formed on the fourth surface (11E). For example, the fourth conductor part 214 has a frame shape, and is surrounded by the frame-shaped fifth conductor part 215. The fifth conductor part 215 is surrounded by the frame-shaped sixth conductor part 216. The fifth conductor part 215 corresponds to the third metal layer 21. The fourth conductor part 214 surrounds a space (SP4). There is a space (SP2) between the fourth conductor part 214 and the fifth conductor part 215. There is a space (SP3) between the fifth conductor part 215 and the sixth conductor part 216. FIG. 15A schematically illustrates positional relationships of the conductor parts (201, 202, 223, 214, 215, 216). As illustrated in FIG. 15A, when the fourth conductor part 214 and the fifth conductor part 215 are projected on the third surface (11D) with light perpendicular to the third surface (11D), the fourth conductor part 214 partially overlaps the third conductor part 223. Further, the fifth conductor part 215 partially overlaps the third conductor part 223. The space (SP2) between the fourth conductor part 214 and the fifth conductor part 215 overlaps the third conductor part 223. That is, the third conductor part 223 is positioned above the space (SP2) and completely covers the space (SP2). An outer peripheral portion of the third conductor part 223 is positioned above the fifth conductor part 215. An inner peripheral portion of the third conductor part 223 is positioned above the fourth conductor part 214. As illustrated in FIG. 15A, when the space (SP3) between the fifth conductor part 215 and the sixth conductor part 216 is projected on the second surface (11B) with light perpendicular to the second surface (11B), the space (SP3) and the space (SP1) between the first conductor part 201 and the second conductor part 202 substantially overlap each other. FIG. 15A is a simplified cross-sectional view.

Figure 10:
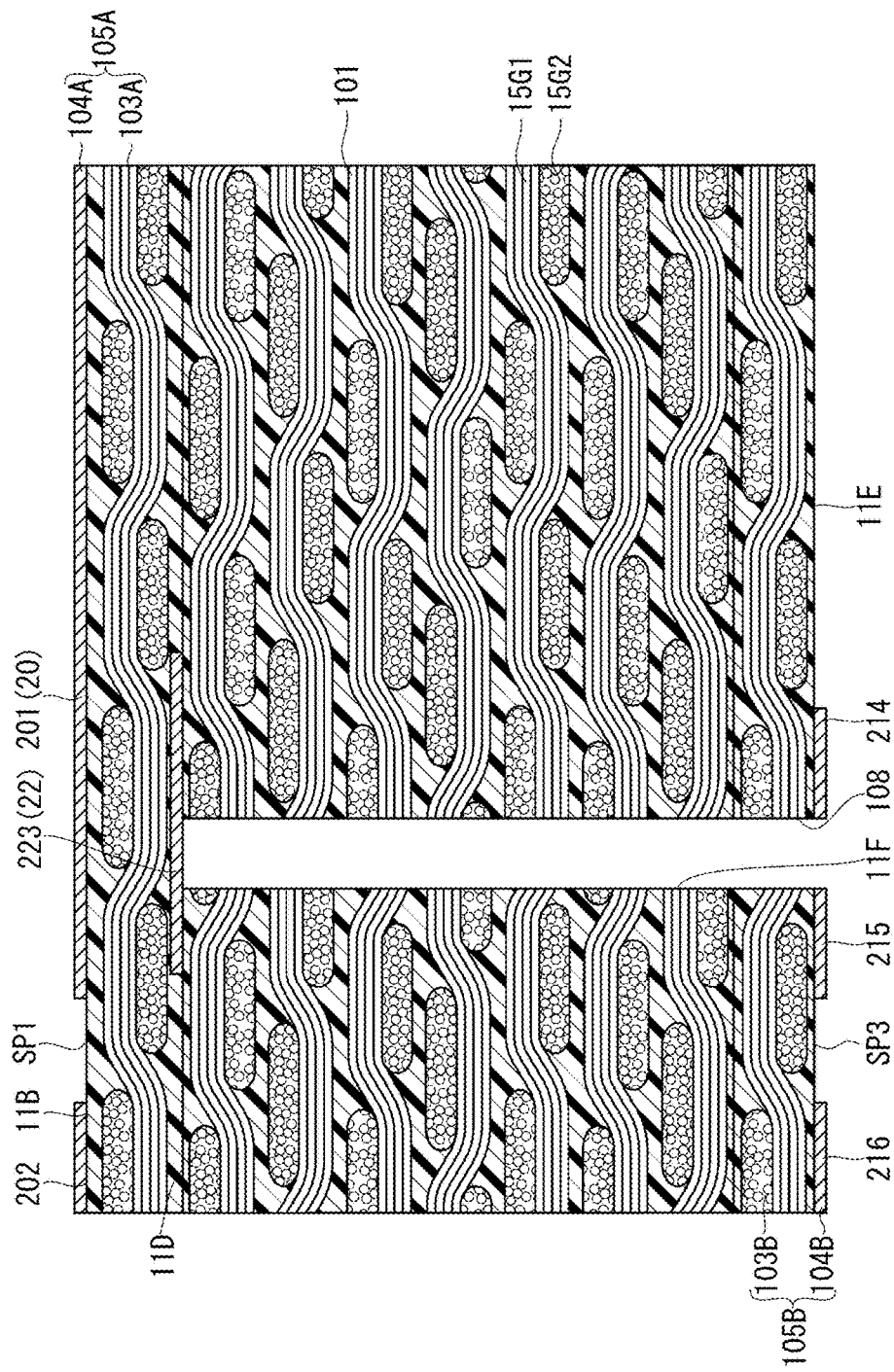
FIG. 10 is a cross-sectional view illustrating a manufacturing process of the shield cap.

(5) As illustrated in FIG. 10, using the fourth conductor part 214 and the fifth conductor part 215 as a mask, laser is irradiated to the space (SP2) between the fourth conductor part 214 and the fifth conductor part 215. An opening 108 penetrating the third insulating layer (103B) and the first insulating layer 101 and reaching the first metal layer 22 is formed. The opening 108 reaches the third conductor part 223. A starting point and an ending point of the opening 108 are connected to each other. For example, the opening 108 has a frame-shaped planar shape. Depending on a processing condition, a portion of the fifth surface (11F) of a predetermined length (less than 30 μm) extending from the third surface (11D) may be bent such that the side wall part 13 is reduced in thickness.

Figure 11:
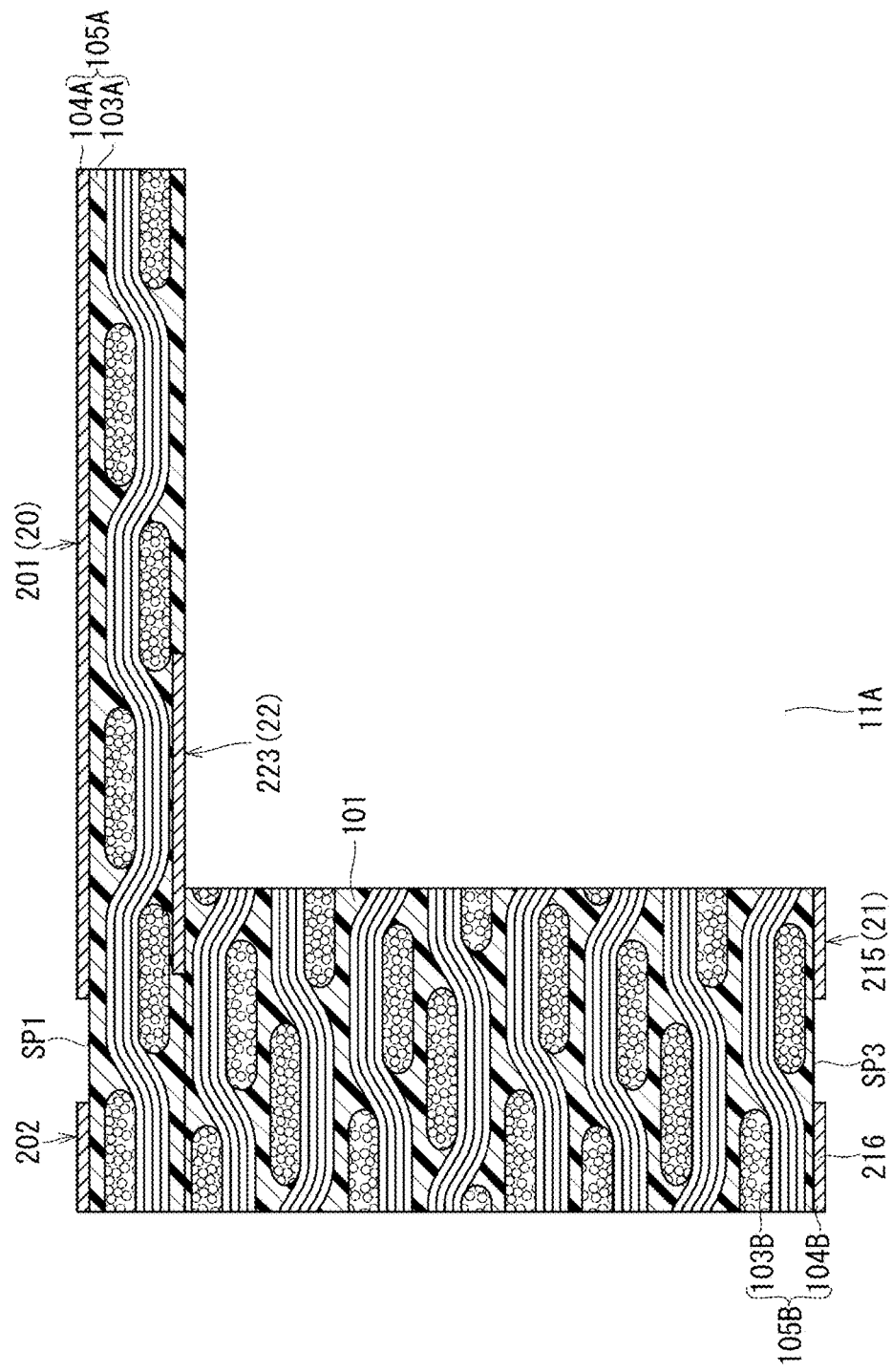
FIG. 11 is a cross-sectional view illustrating a manufacturing process of the shield cap.

(6) As illustrated in FIG. 11, the third insulating layer (103B) and the first insulating layer 101 that are surrounded by the opening 108 are cut using a router. As a result, the space (11A) is formed. Specifically, the router is inserted into the opening 108. When a front end part of the router touches the first metal layer 22, the insertion stops. Thereafter, the router is moved in a lateral direction. Thereby, the third insulating layer (103B) and the first insulating layer 101 that are surrounded by the opening 108 are removed.

Figure 12:
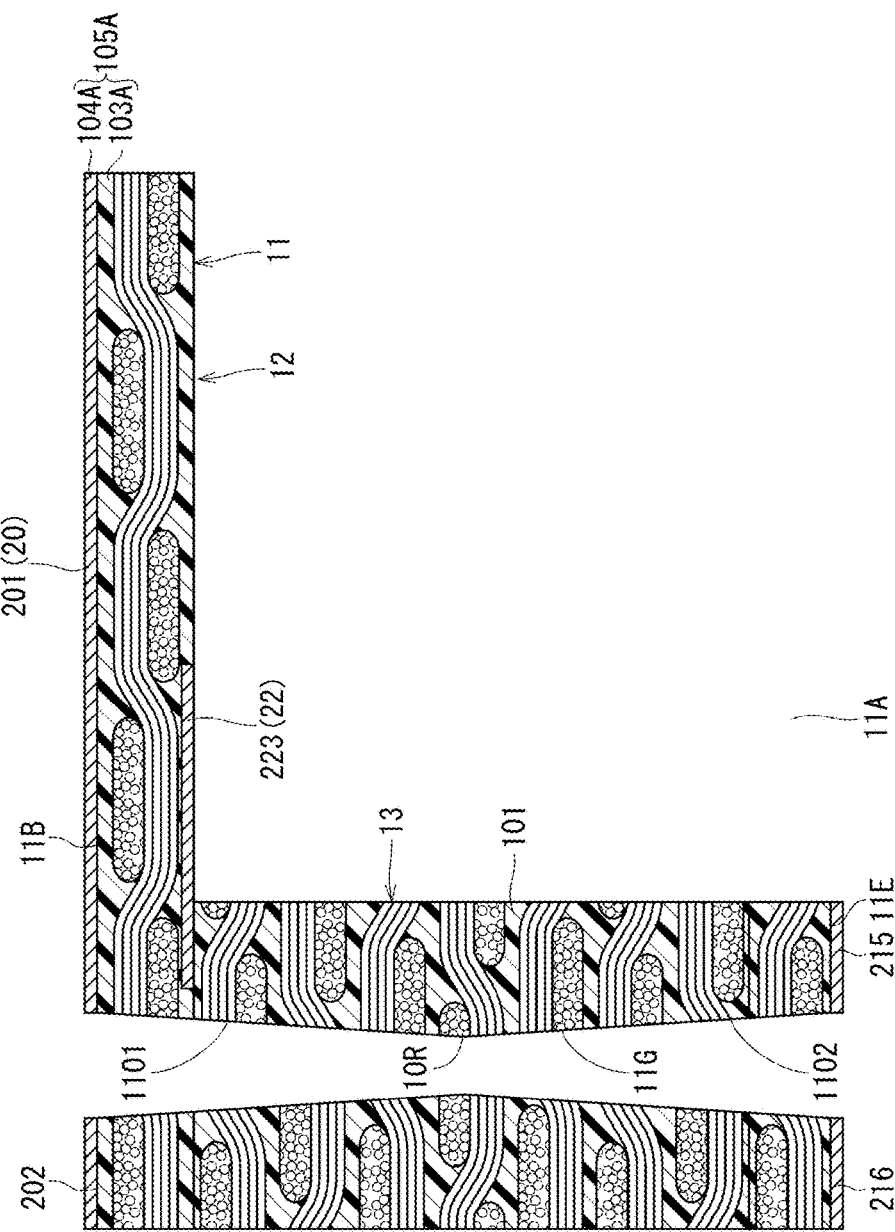
FIG. 12 is a cross-sectional view illustrating a manufacturing process of the shield cap.

(7) As illustrated in FIG. 12, using the first conductor part 201 and the second conductor part 202 as a mask, first laser is irradiated to the space (SP1) between the first conductor part 201 and the second conductor part 202. As a result, a first opening 1101 that is reduced in width from the second surface (11B) toward the bent part (10R) is formed. Thereafter, using the fifth conductor part 215 and the sixth conductor part 216 as a mask, second laser is irradiated to the space (SP3) between the fifth conductor part 215 and the sixth conductor part 216. As a result, a second opening 1102 that is reduced in width from the fourth surface (11E) toward the bent part (10R) is formed. The first opening 1101 and the second opening 1102 are connected to each other, and the sixth surface (11G) is formed. The ceiling part 12 and the side wall part 13 are formed. One cap member 11 is obtained from the laminate.

(8) An electroless plating treatment is performed, and the electroless plating film 31 is formed on the cap member 11. Next, an electrolytic plating treatment is performed, and the electrolytic plating film 32 is formed on the cap member 11. The conductive film 30 that is formed from the electroless plating film 31 and the electrolytic plating film 32 on the electroless plating film 31 covers the cap member 11. The shield cap 10 illustrated in FIG. 1 is completed.

The cap member 11 is manufactured by cutting the laminate. Therefore, according to the manufacturing method of the first embodiment, a mold used in an injection molding method or a press molding method is unnecessary. As a result, a high mold cost can be suppressed. The manufacturing cost can be reduced. The manufacturing process is simplified. In FIGS. 11 and 12, a region between the first conductor part 201 and the second conductor part 202 is used as the space (SP1). However, the second conductor part 202 can be removed/In this case, for example, a region between the first conductor part 201 and the first conductor part 201 of adjacent cap members (11, 11) can be used as the space (SP1). Further, the space (SP3) between the fifth conductor part 215 and the sixth conductor part 216 can be removed. A region between the fifth conductor part 215 and the fifth conductor part 215 of adjacent cap member (11, 11) can be used as the space (SP3).

Second Embodiment

Figure 13:
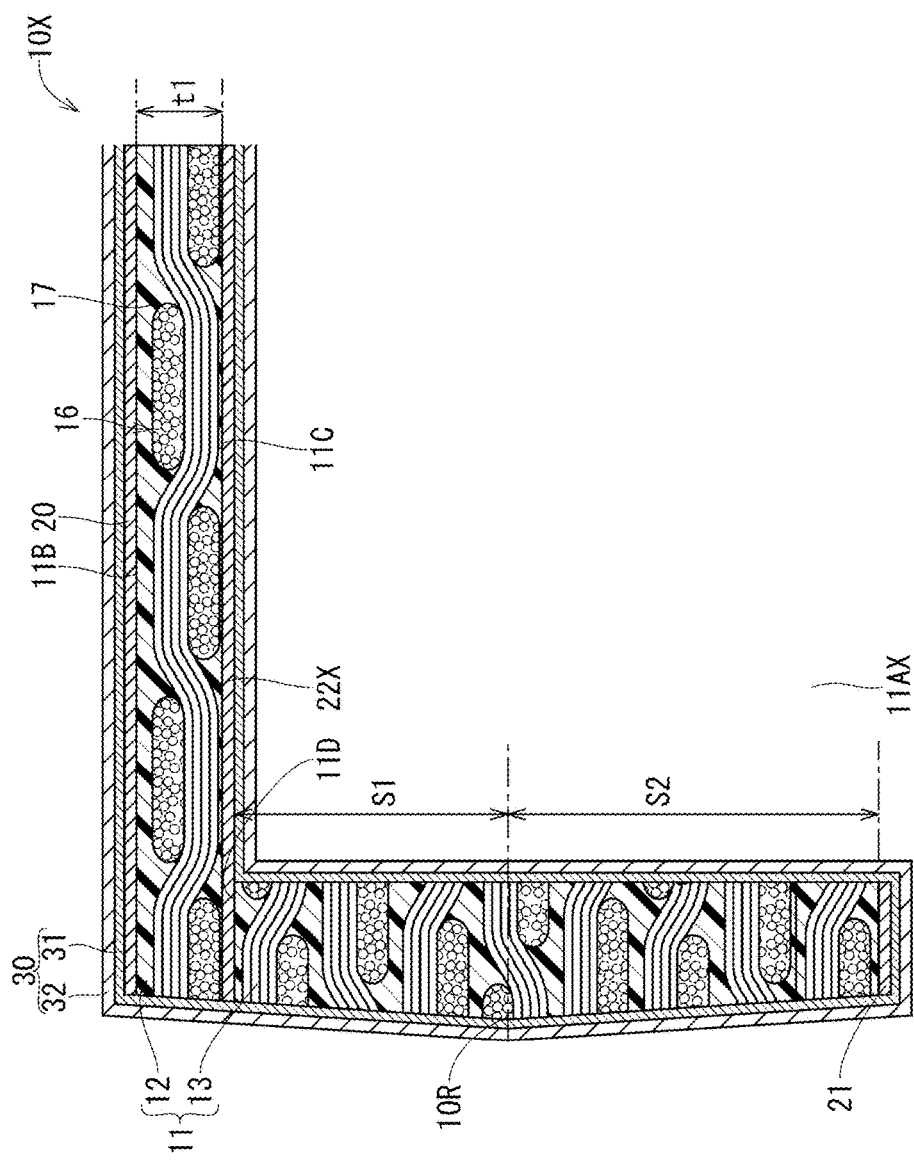
FIG. 13 is an enlarged cross-sectional view of a shield cap according to a second embodiment of the present invention.
Figure 14:
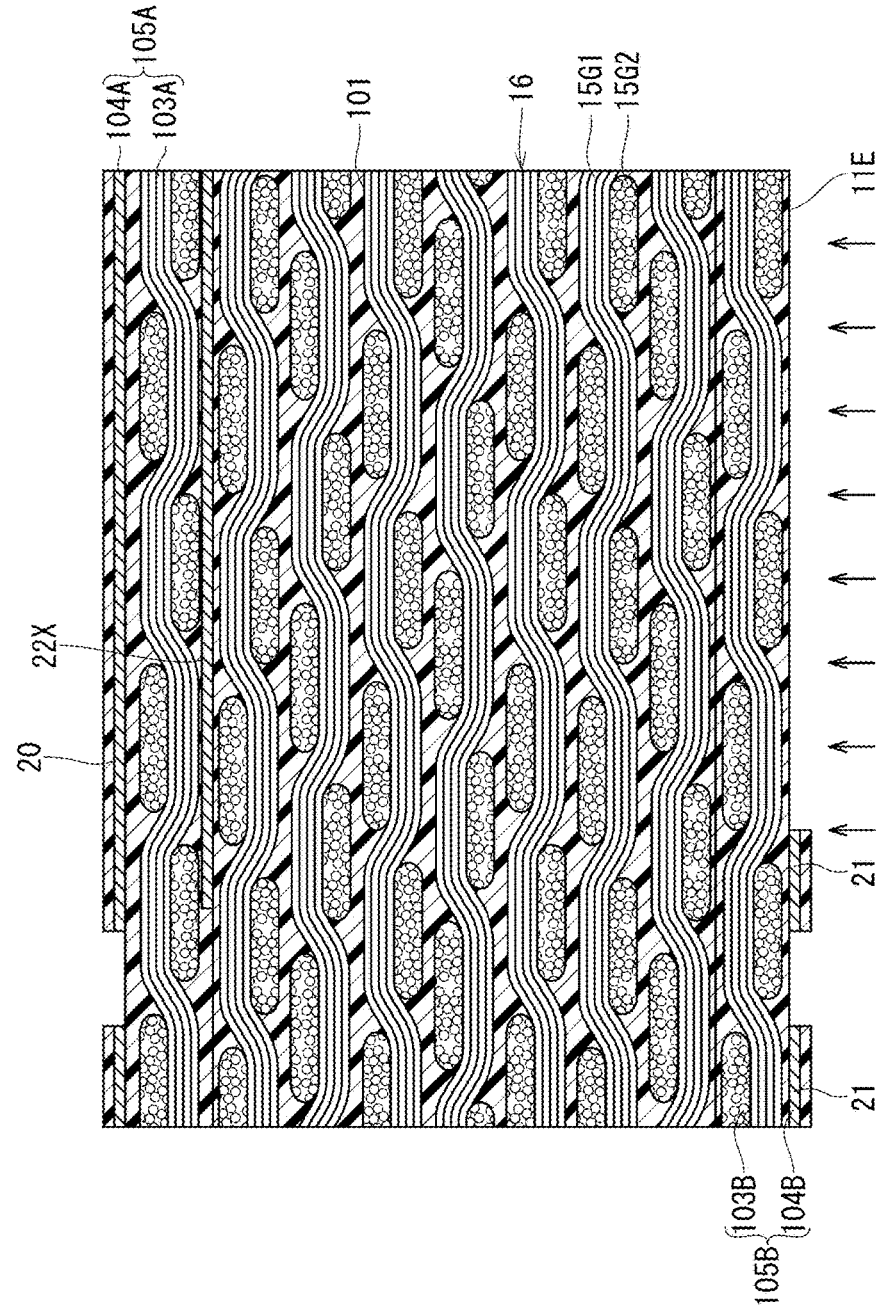
FIG. 14 is a cross-sectional view illustrating a manufacturing process of the shield cap.

A second embodiment is described with reference to FIG. 13-14. As illustrated in FIG. 13, a shield cap (10X) of the second embodiment is different from the shield cap 10 of the first embodiment in that a first metal layer (22X) has a different shape. As illustrated in FIG. 13, the first metal layer (22X) of the second embodiment is formed between the first surface (11C) and the third surface (11D) and on a space (11AX). The first metal layer (22X) has substantially the same shape and size as the second metal layer 20. The first metal layer (22X) completely covers the space (11AX). The first metal layer (22X) completely covers the third surface (11D).

Further, in the shield cap (10X) of the second embodiment, the space (11AX) is formed by blasting. It is in such a point that a method for manufacturing the shield cap 10 of the second embodiment is different from that of the first embodiment. Specifically, instead of a router, blasting is performed from a direction of arrows illustrated in FIG. 14. As a result, the space (11AX) is formed.

In each of the embodiments, the shield cap 10 contains the resin 17. The cap member 11 containing the resin 17 is a main part of the shield cap 10. When the main part of the shield cap 10 is formed of a metal, the weight of the shield cap is likely to increase. In contrast, in each of the embodiments, the weight of the shield cap 10 can be reduced. Further, in each of the embodiments, since the shield cap 10 contains the reinforcing material, the ceiling part 12 has high strength. Therefore, deflection of the ceiling part 12 can be suppressed. The thickness of the ceiling part 12 can be reduced. As a result, the weight of the shield cap 10 can be further reduced.

Even when a semiconductor element is protected by the metal cap of Japanese Patent Laid-Open Publication No. 2002-237542, the semiconductor element may malfunction.

A shield cap for protecting an electronic component according to an embodiment of the present invention includes: a cap member that includes a side wall part and a ceiling part, the side wall part having a third surface and a fourth surface that is on an opposite side of the third surface, and the ceiling part having a first surface facing the third surface and a second surface that is on an opposite side of the first surface; a conductive film that is formed on the cap member; and a third metal layer that is formed between the fourth surface and the conductive film. The side wall part and the ceiling part form a space that accommodates the electronic component.

A method for manufacturing a shield cap for protecting an electronic component according to another embodiment of the present invention includes: preparing a first prepreg for forming a ceiling part that has a first surface; preparing a second prepreg for forming a side wall part that has a third surface; forming a laminate by laminating the first prepreg on the second prepreg such that the first surface and the third surface face each other; forming a cap member from the side wall part and the ceiling part by forming a space for accommodating the electronic component in the laminate, the side wall part having a fourth surface on an opposite side of the third surface, and the ceiling part having a second surface on an opposite side of the first surface; forming a third metal layer on the fourth surface; and forming a conductive film on the cap member.

Obviously, numerous modifications and variations of the present invention are possible in light of the above teachings. It is therefore to be understood that within the scope of the appended claims, the invention may be practiced otherwise than as specifically described herein.

The invention claimed is:

1. A shield cap for protecting an electronic component, comprising:
   a cap member having a side wall portion and a ceiling portion;
   a conductive film formed on the cap member such that the conductive film is configured to shield electromagnetic waves; and
   a metal layer formed on a portion of the side wall portion such that the metal layer is interposed between the conductive film and the portion of the side wall portion,
   wherein the cap member is formed such that the side wall portion and the ceiling portion are forming an accommodation space configured to accommodate an electronic component and that the ceiling portion has a first surface facing the accommodation space and a second surface on an opposite side with respect to the first surface, the side wall portion has a third surface facing the ceiling portion, a fourth surface on an opposite side with respect to the third surface, a fifth surface facing the accommodation space, and a sixth surface on an opposite side with respect to the fifth surface, the metal layer is formed on the fourth surface of the side wall portion such that the metal layer is interposed between the conductive film and the fourth surface of the side wall portion, the ceiling portion comprises a resin material and a reinforcing material such that the reinforcing material is formed to extend substantially parallel with respect to an upper surface of the ceiling portion, the side wall portion comprises a resin material and a reinforcing material such that the reinforcing material of the side wall portion is formed to extend substantially parallel with respect to an upper surface of the ceiling portion, and the side wall portion is formed such that the sixth surface has a first inclined portion increasing a distance to the accommodation space from the third surface toward the fourth surface and a second inclined portion increasing a distance to the accommodation space from the fourth surface toward the third surface.

2. A shield cap for protecting an electronic component according to claim 1, wherein the reinforcing material of the ceiling portion comprises a glass cloth, and the reinforcing material of the side wall portion comprises a glass cloth.

3. A shield cap for protecting an electronic component according to claim 2, wherein the side wall portion and the ceiling portion comprise prepreg material.

4. A shield cap for protecting an electronic component according to claim 2, further comprising:
   a first metal layer interposed between the side wall portion and the ceiling portion.

5. A shield cap for protecting an electronic component according to claim 4, wherein the first metal layer is formed on the first surface of the ceiling portion.

6. A shield cap for protecting an electronic component according to claim 1, further comprising:
   a second metal layer interposed between the conductive film and the ceiling portion such that the second metal layer is formed on the second surface of the ceiling portion.

7. A shield cap for protecting an electronic component according to claim 1, wherein the cap member is formed such that the ceiling portion has a polygonal form such that the polygonal form includes at least one diagonal length that is 100 times or more than a thickness of the ceiling portion.

8. A shield cap for protecting an electronic component according to claim 2, wherein the conductive film comprises a plating film formed on the cap member and is formed such that the conductive film is covering the cap member entirely.

9. A shield cap for protecting an electronic component according to claim 2, wherein the side wall portion and the ceiling portion comprise prepreg material.

10. A shield cap for protecting an electronic component according to claim 2, further comprising:

a first metal layer interposed between the side wall portion and the ceiling portion.

11. A shield cap for protecting an electronic component according to claim 10, wherein the first metal layer is formed on the first surface of the ceiling portion.

12. A shield cap for protecting an electronic component according to claim 2, further comprising:
a second metal layer interposed between the conductive film and the ceiling portion such that the second metal layer is formed on the second surface of the ceiling portion.

13. A shield cap for protecting an electronic component according to claim 2, wherein the cap member is formed such that the ceiling portion has a polygonal form such that the polygonal form includes at least one diagonal length that is 100 times or more than a thickness of the ceiling portion.

14. A shield cap for protecting an electronic component according to claim 2, wherein the conductive film comprises a plating film formed on the cap member and is formed such that the conductive film is covering the cap member entirely.

15. A shield cap for protecting an electronic component according to claim 3, further comprising:
a first metal layer interposed between the side wall portion and the ceiling portion.

16. A shield cap for protecting an electronic component according to claim 15, wherein the first metal layer is formed on the first surface of the ceiling portion.

17. A shield cap for protecting an electronic component according to claim 3, further comprising:
a second metal layer interposed between the conductive film and the ceiling portion such that the second metal layer is formed on the second surface of the ceiling portion.

18. A shield cap for protecting an electronic component according to claim 3, wherein the cap member is formed such that the ceiling portion has a polygonal form such that the polygonal form includes at least one diagonal length that is 100 times or more than a thickness of the ceiling portion.

19. A shield cap for protecting an electronic component according to claim 3, wherein the conductive film comprises a plating film formed on the cap member and is formed such that the conductive film is covering the cap member entirely.

20. A shield cap for protecting an electronic component according to claim 4, wherein the conductive film comprises a plating film formed on the cap member and is formed such that the conductive film is covering the cap member entirely.

* * * * *